United States Patent [19]
Yang et al.

[11] Patent Number: 5,677,227
[45] Date of Patent: Oct. 14, 1997

[54] METHOD OF FABRICATING SINGLE CROWN, EXTENDIBLE TO TRIPLE CROWN, STACKED CAPACITOR STRUCTURES, USING A SELF-ALIGNED CAPACITOR NODE CONTACT

[75] Inventors: Fu-Liang Yang, Tainan; Erik S. Jeng, Taipei, both of Taiwan

[73] Assignee: Vanguard International Semiconductor Corporation, Hsin-Chu, Taiwan

[21] Appl. No.: 709,898

[22] Filed: Sep. 9, 1996

[51] Int. Cl.$^6$ .................................. H01L 21/8242
[52] U.S. Cl. .......................... 437/60; 437/193; 437/200; 437/919
[58] Field of Search ................. 437/60, 193, 195, 437/200, 919, 978

[56] References Cited

U.S. PATENT DOCUMENTS

| | | | |
|---|---|---|---|
| 5,185,282 | 2/1993 | Lee et al. | 437/47 |
| 5,278,091 | 1/1994 | Fazan et al. | 437/60 |
| 5,476,806 | 12/1995 | Roh et al. | 437/52 |
| 5,491,103 | 2/1996 | Ahn et al. | 437/52 |
| 5,620,918 | 4/1997 | Kondoh | 437/60 |

*Primary Examiner*—Chandra Chaudhari
*Attorney, Agent, or Firm*—George O. Saile; Stephen B. Ackerman

[57] ABSTRACT

A process for creating a stacked capacitor, dynamic random access memory device, featuring increased capacitor surface area, resulting from a polysilicon, triple crown shaped, lower electrode structure, and also featuring self-alignment of the stacked capacitor contact structure, to a bit line contact structure, has been developed. The triple crown shaped, lower electrode structure is comprised of polysilicon spacers, formed via use of polysilicon and silicon oxide, low pressure chemical deposition, and anisotropic RIE, procedures.

21 Claims, 16 Drawing Sheets

METHOD OF FABRICATING SINGLE CROWN, EXTENDIBLE TO TRIPLE CROWN, STACKED CAPACITOR STRUCTURES, USING A SELF-ALIGNED CAPACITOR NODE CONTACT

BACKGROUND OF THE INVENTION (1) Field of the Invention

The present invention relates to methods used to fabricate semiconductor devices, and more specifically to fabrication procedures used to create memory devices, with increased capacitance.

(2) Background of the Invention

The semiconductor industry is continually striving to increase the performance of semiconductor devices, while still maintaining, or decreasing the cost of these devices. These objectives have been addressed by the trend to semiconductor devices with smaller dimensions. Smaller devices, with smaller features result in decreases in parasitic capacitance, as well as decrease in resistances, both allowing higher performance devices to be realized. In addition the smaller specific devices allows a greater number of semiconductor chips to be obtained from a specific size starting wafer, then would have been available using larger devices with larger features, thus cost reductions, in terms of more semiconductor chips for a specific size wafer, is realized. The reduction in device dimension has been arrived at mainly by advances in specific semiconductor fabrication disciplines, such as photolithography and anisotropic, reactive ion etching, (RIE). For example more sophisticated exposure cameras, as well as the development of more sensitive photoresist materials, have resulted in the routine attainment of sub-micron images, in photoresist layers. In addition similar advances in the dry etching sectors have allowed the successful transfer of these sub-micron images in photoresist layers, to underlying materials, used for the creation of advanced semiconductor devices. Other semiconductor fabrication disciplines, such as low pressure chemical vapor deposition, and ion implantation, have also greatly contributed to the attainment of smaller semiconductor devices.

However for the dynamic random access memory, (DRAM), technology, in which a transfer gate transistor, and a capacitor structure, are used, the smaller transfer gate transistor, although satisfying the cost objective of the manufacturer, limits the dimensions of the overlying stacked capacitor, and thus limits the capacitance or signal of the DRAM device. The ability to increase DRAM performance, or signal, by increasing the capacitance of the stacked capacitor structure, has been addressed by either the use of thinner capacitor dielectric layers, the use of a dielectrics with greater capacitive properties, or increasing the size of the capacitor. This invention will feature a process for stacked capacitor DRAM devices, in which the area of the stacked capacitor is increased, while still maintaining the overlying, the small transfer gate transistor, needed to achieve cost objectives. This is obtained via a method used to create a crown shaped capacitor node, resulting in an increase in capacitor surface area. In addition this invention will also describe a self-aligned process for the capacitor node contact, used to simplify the DRAM fabrication process. Prior art, such as Roh, et al. in U.S. Pat. No. 5,476,806, describe a stacked capacitor structure, with increased surface area, however the use of the combination of increased capacitor surface area, and a self-aligned capacitor node contact, is not described in this prior art.

SUMMARY OF THE INVENTION

It is an object of this invention to form a capacitor storage node, with a crown shape, to increase the surface area of a stacked capacitor structure of a DRAM device.

It is another object of this invention to form a capacitor storage node, with a triple crown shape, to further increase the surface area of a stacked capacitor structure of a DRAM device.

It is yet another object of this invention to use a self aligning method, for contact of the capacitor structure, to the transfer gate transistor.

In accordance with this invention a method for fabricating stacked capacitor, DRAM devices, with single, or triple, crown shape, capacitor storage nodes, to increase the surface area of the capacitor, as well a method for self-aligning the capacitor structure to the DRAM device, is described. After formation of field oxide regions a gate dielectric layer is grown. Layers of a first polysilicon, a first metal silicide, silicon oxide and silicon nitride, are next deposited and patterned to create the polycide gate structures, on the gate insulator, as well as polycide gate structures on the field oxide region. A lightly doped source and drain region is created via ion implantation procedures, followed by formation of an insulator spacer, on the sides of the polycide gate structures, and subsequently followed by another ion implantation procedure, used to create heavily doped regions in the semiconductor substrate. A first borophosphosilicate, (BPSG), layer is next deposited, and planarized via chemical mechanical polishing, (CMP). Photolithographic and reactive ion etching, (RIE), procedures are used to form a first BPSG land on the polycide gate structures. A second polysilicon layer is deposited, completely filling the spaces between polycide gate structures, followed by deposition of a second metal silicide layer, a silicon oxide layer, and a silicon nitride layer. Patterning is performed, using photolithographic and RIE procedures, to form a bit line contact structure, between polycide gate structures, on the gate insulator, while initiating the self-aligned, storage node contact structure by leaving some second polysilicon layer, between the polycide gate structure, on the gate insulator, and the polycide gate structure, on the field oxide region. Insulator spacers are next formed on the bit line contact structures, followed by the deposition of a third polysilicon layer. A second BPSG layer is deposited, planarized, and patterned to create a second BPSG land, on the third polysilicon layer, overlying the bit line contact structures. A fourth polysilicon layer is deposited, on the second BPSG lands, as well as on regions of the third polysilicon layer, not covered by the second BPSG lands. Anisotropic RIE procedures remove the fourth polysilicon layer from the top surface of the second BPSG lands, resulting in a polysilicon sidewall, created from the fourth polysilicon layer, on the sides of the second BPSG lands. The second BPSG lands are next removed via dry or wet etching procedures, exposing the third polysilicon layer, between the polysilicon sidewalls. Photoresist processing is then used to remove the third polysilicon layer, from between the polysilicon sidewalls, exposing the top surface of the silicon nitride layer, of the bit line contact structure. Capacitor dielectric, polysilicon deposition and patterning, complete the formation of a self-aligned, stacked capacitor structure, with single crown shape, or polysilicon sidewalls.

The triple crown shape, capacitor storage node structure is formed by creating insulator sidewalls on the polysilicon sidewall, which was formed from the fourth polysilicon layer, and depositing a fifth polysilicon layer, to subsequently create additional polysilicon sidewalls. After anisotropic removal of the fifth polysilicon layer, exposing the top of the insulator sidewalls, the insulator sidewall layer is then selectively removed resulting in a triple crown shape, capacitor storage node structure, comprised of two outside, polysilicon sidewalls, created from the fifth polysilicon layer, and an inner polysilicon sidewall, created from the fourth polysilicon layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
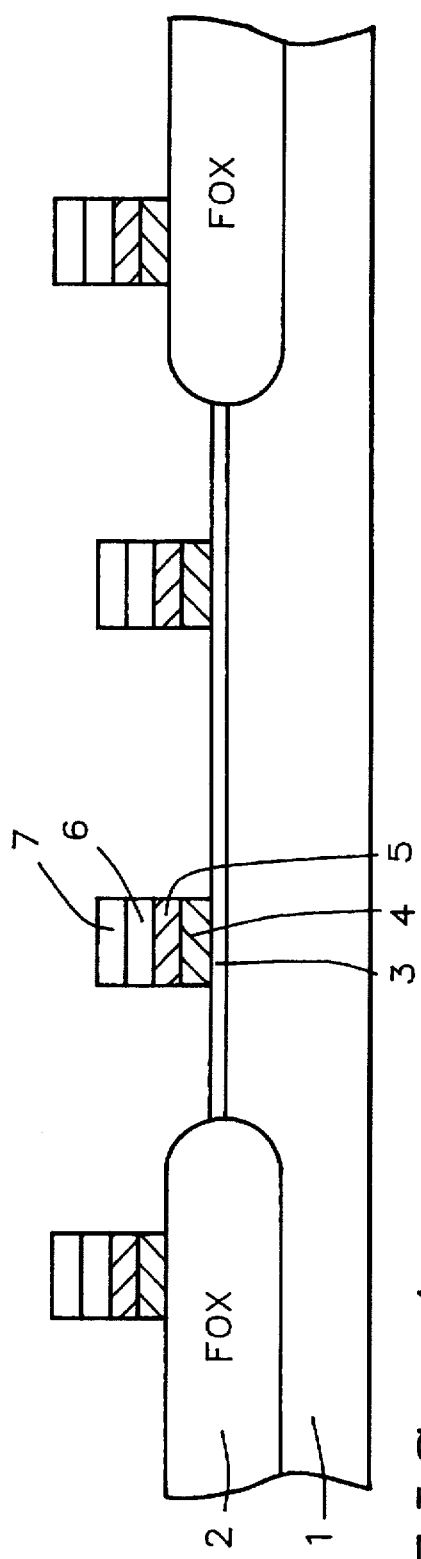
FIGS. 1–13, which schematically, in cross-sectional style, show the formation of a single crown shape, capacitor storage node structure, using self-alignment methods for capacitor structure contacts.

The method of fabricating stacked capacitor, DRAM devices, with single, as well as triple crown shaped capacitor nodes, and using self-aligned capacitor contacts, will now be covered in detail. FIG. 1, shows a P type, silicon substrate, 1, composed of silicon with a <100> crystallographic orientation. Field oxide, (FOX), 2, regions, are thermally grown, in an oxygen—steam ambient, at a temperature between about 850° to 1050° C., to a thickness between about 4000 to 6000 Angstroms. An oxidation mask, composed of an overlying silicon nitride layer, and an underlying silicon oxide layer, are patterned, using photolithographic and reactive ion etching, (RIE), procedures, producing the desired pattern to be used as the composite oxidation mask during the FOX oxidation procedure. At the conclusion of the FOX procedure the composite oxidation mask is removed, exposing the subsequent device region, surrounded by the FOX, 2, isolation regions. Next a silicon dioxide layer, 3, is thermally grown at a temperature between about 850° to 1000° C., to a thickness between about 50 to 300 Angstroms, to be used for the gate dielectric. A first polysilicon layer, 4, is deposited, using low pressure chemical vapor deposition, (LPCVD), procedures, at a temperature between about 400° to 700° C., to a thickness between about 500 to 2000 Angstroms. Polysilicon layer, 4, can be deposited using insitu doping procedures, by the addition of phosphine to a silane ambient, or polysilicon layer, 4, can be grown intrinsically, and doped via ion implantation of phosphorous, at an energy between about 50 to 100 Key, at a dose between about 5E14 to 1E16 atoms/cm$^2$. Also shown schematically in FIG. 1, is a first layer of tungsten silicide, 5, deposited using LPCVD procedures, at a temperature between about 400° to 600° C., to a thickness between about 500 to 2000 Angstroms, using silane and tungsten hexafluoride as a source. A layer of silicon oxide, 6, is next deposited using either LPCVD or plasma enhanced chemical vapor deposition, (PECVD), processing, at a temperature between about 300° to 800° C., to a thickness between about 100 to 500 Angstroms, using tetraethylorthosilicate, (TEOS), as a source, followed by deposition of a silicon nitride layer, 7, again via use of LPCVD procedures, at a temperature between about 600° to 800° C., to a thickness between about 500 to 1500 Angstroms. Photolithographic and RIE procedures, using CHF$_3$ as an etchant for silicon nitride layer, 7, CF$_4$ as an etchant for silicon oxide layer, 6, and Cl$_2$ as an etchant for first tungsten silicide layer, 5, and first polysilicon layer, 4, are used to form the polycide gate structures shown in FIG. 1. Photoresist removal is performed using plasma oxygen ashing and careful wet cleans.

Figure 2:
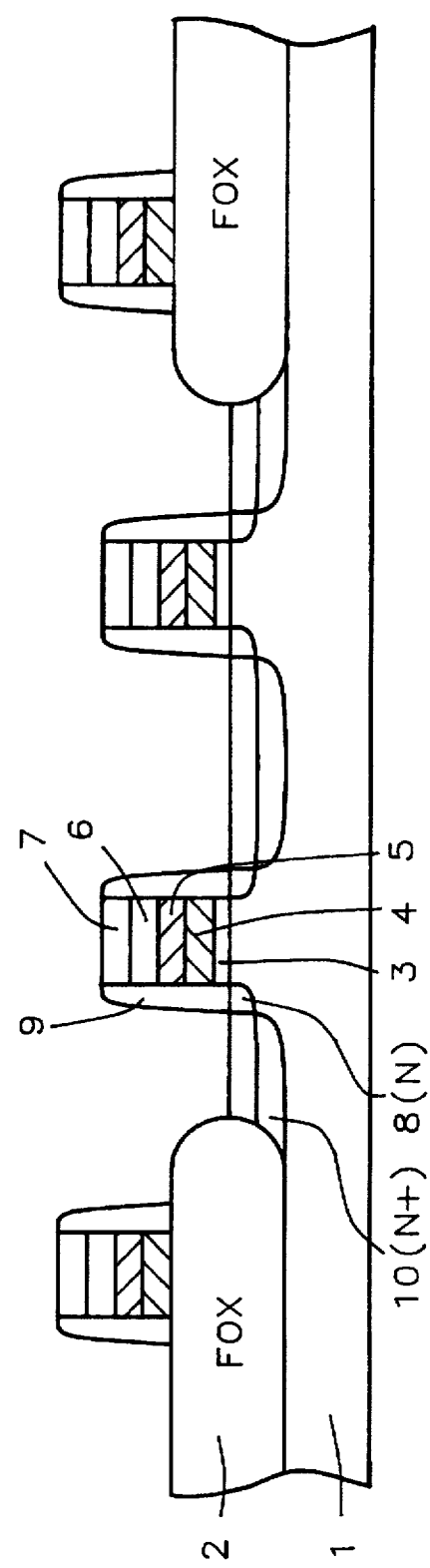

A lightly doped source and drain region, 8, shown schematically in FIG. 2, is next created, via ion implantation of phosphorous, at an energy between about 25 to 75 KeV, at a dose between about 1E12 to 5E13 atoms/cm$^2$. A silicon nitride layer is then deposited, using either LPCVD or PECVD procedures, at a temperature between about 300° to 800° C., to a thickness between about 500 to 1500 Angstroms, and subjected to an anisotropic RIE procedure, using, CF$_4$–CHF$_3$ as an etchant, to form a first insulator spacer, 9, on the sides of the polycide gate structures. Heavily doped source and drain regions, 10, also shown schematically in FIG. 2, are created via ion implantation of arsenic or phosphorous, at an energy between about 30 to 80 Kev, at a dose between about 1E13 to 1E15 atoms/cm$^2$.

Figure 3:
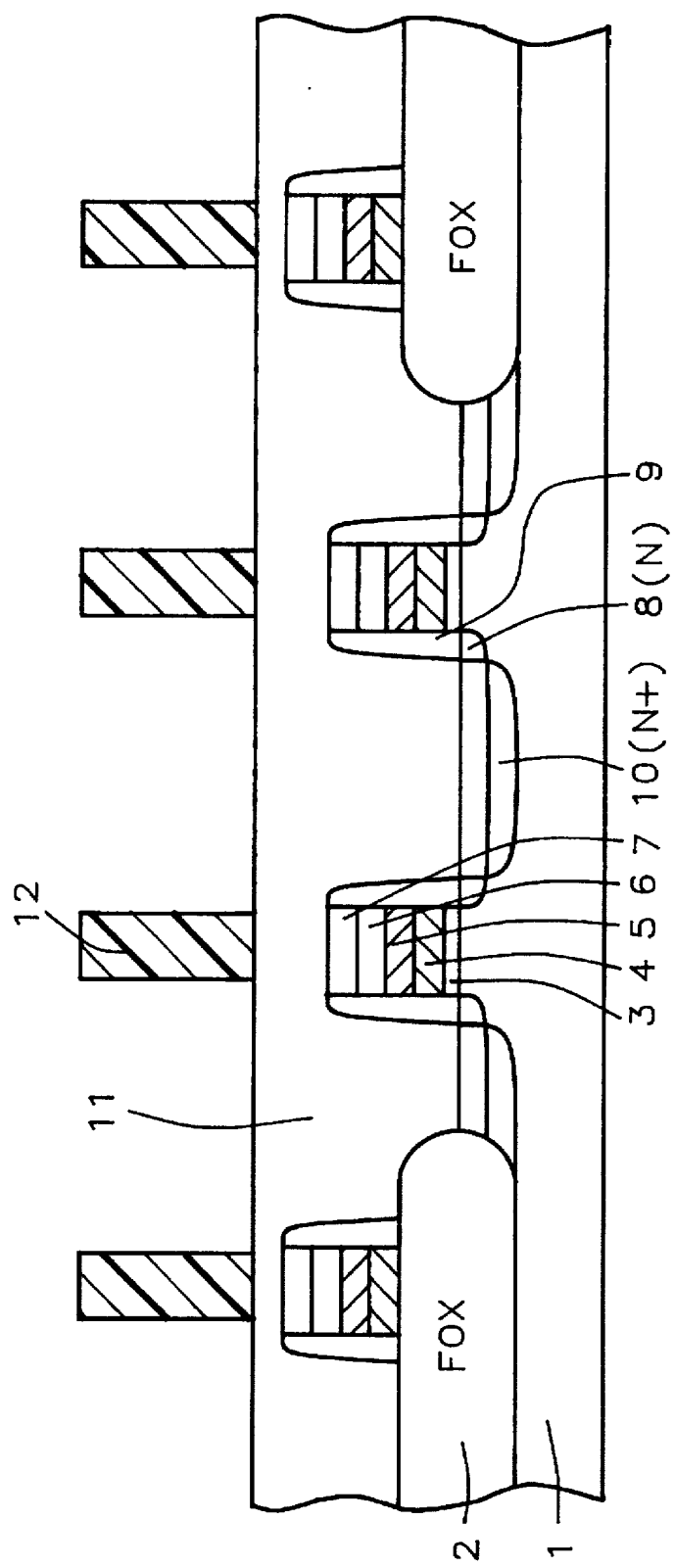
Figure 4:
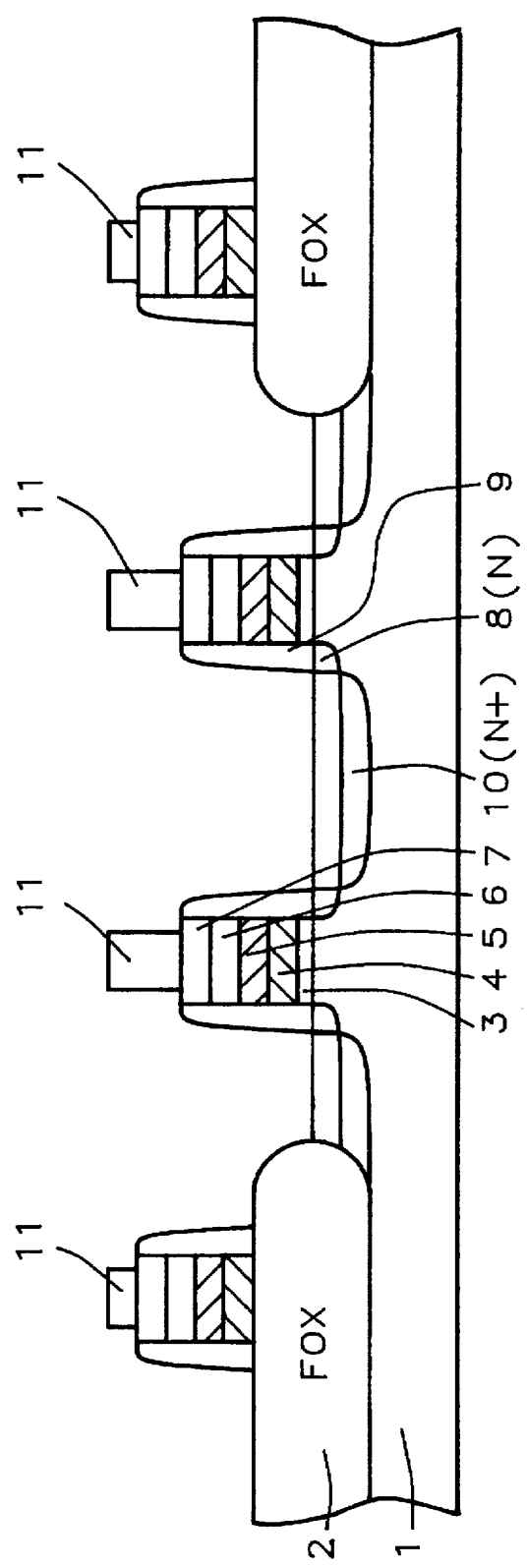

A first layer of boro-phosphosilicate glass, BPSG, 11, is deposited, using CVD procedures, at a temperature between about 400 to 600° C., to a thickness between about 3000 to 10000 Angstroms. BPSG layer, 11, is then subjected to a planarization process, using chemical mechanical polishing procedures, to uncomplicated subsequent photolithographic procedures, in terms of alleviating depth of focus exposures problems. Photoresist pattern, 12, now is used as a mask to define the desired pattern in a thinner, more planar, BPSG layer, 11, shown schematically in FIG. 3. A RIE procedure, using CHF$_3$ as an etchant, is used to create the BPSG lands, overlying the polycide gate structures. Due to the planarization process the thickness of the BPSG lands, overlying polycide gate structure in the device region, are thicker then the BPSG lands, overlying polycide gate structures on FOX regions. This is shown schematically in FIG. 4. Photoresist pattern, 12, is removed via plasma oxygen ashing and careful wet cleans.

Figure 5:
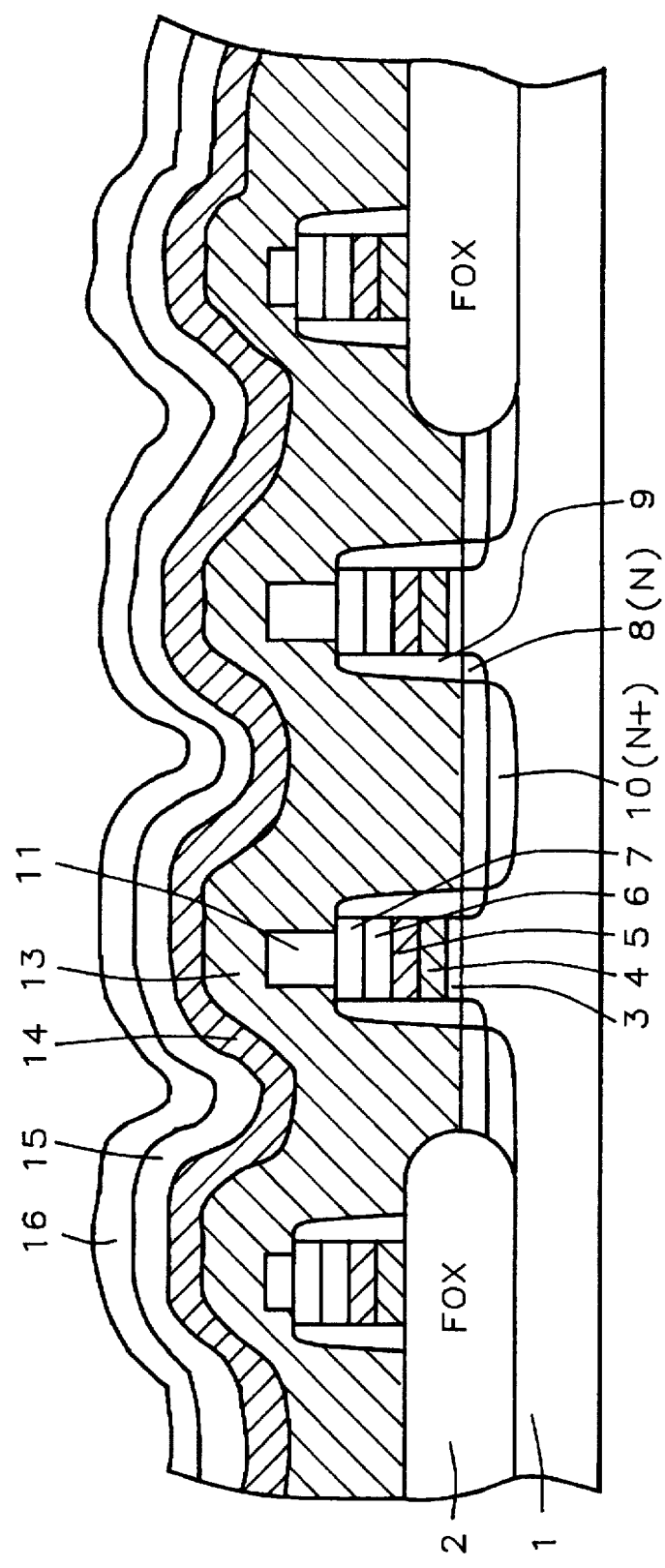

A second layer of polysilicon, 13, is deposited using LPCVD procedures, at a temperature between about 400° to 700° C., to a thickness between about 1000 to 3000 Angstroms. Polysilicon layer, 13, can be grown using insitu doping procedures, identical to insitu doping procedures used for polysilicon layer, 4, or grown intrinsically and doped via ion implantation of phosphorous at an energy between about 50 to 100 Kev, at a dose between about 5E14 to 1E16 atoms/cm$^2$. The polysilicon deposition completely fills the spaces between polycide gate structures, situated in the device regions, as well as completely filling the spaces between polycide gate structures on the device region, and polycide gate structures on the FOX regions. Therefore polysilicon layer, 13, is thicker in these spaces, then in regions in which polysilicon layer, 13, directly overlies a polycide gate structure. This is shown schematically in FIG. 5. A second layer of tungsten silicide, 14, is deposited on polysilicon layer, 13, via LPCVD procedures, at a temperature between about 400° to 600° C., to a thickness between about 500 to 2000 Angstroms, using tungsten hexafluoride and silane, followed by the deposition of silicon oxide layer, 15, obtained via either LPCVD or PECVD procedures, at a temperature between about 300° to 800° C., to a thickness between about 100 to 500 Angstroms, and silicon nitride layer, 16, deposited using LPCVD procedures, at a temperature between about 600 to 800° C., to a thickness between about 1000 to 2000 Angstroms. The result of these depositions is again schematically shown in FIG. 5.

Figure 6:
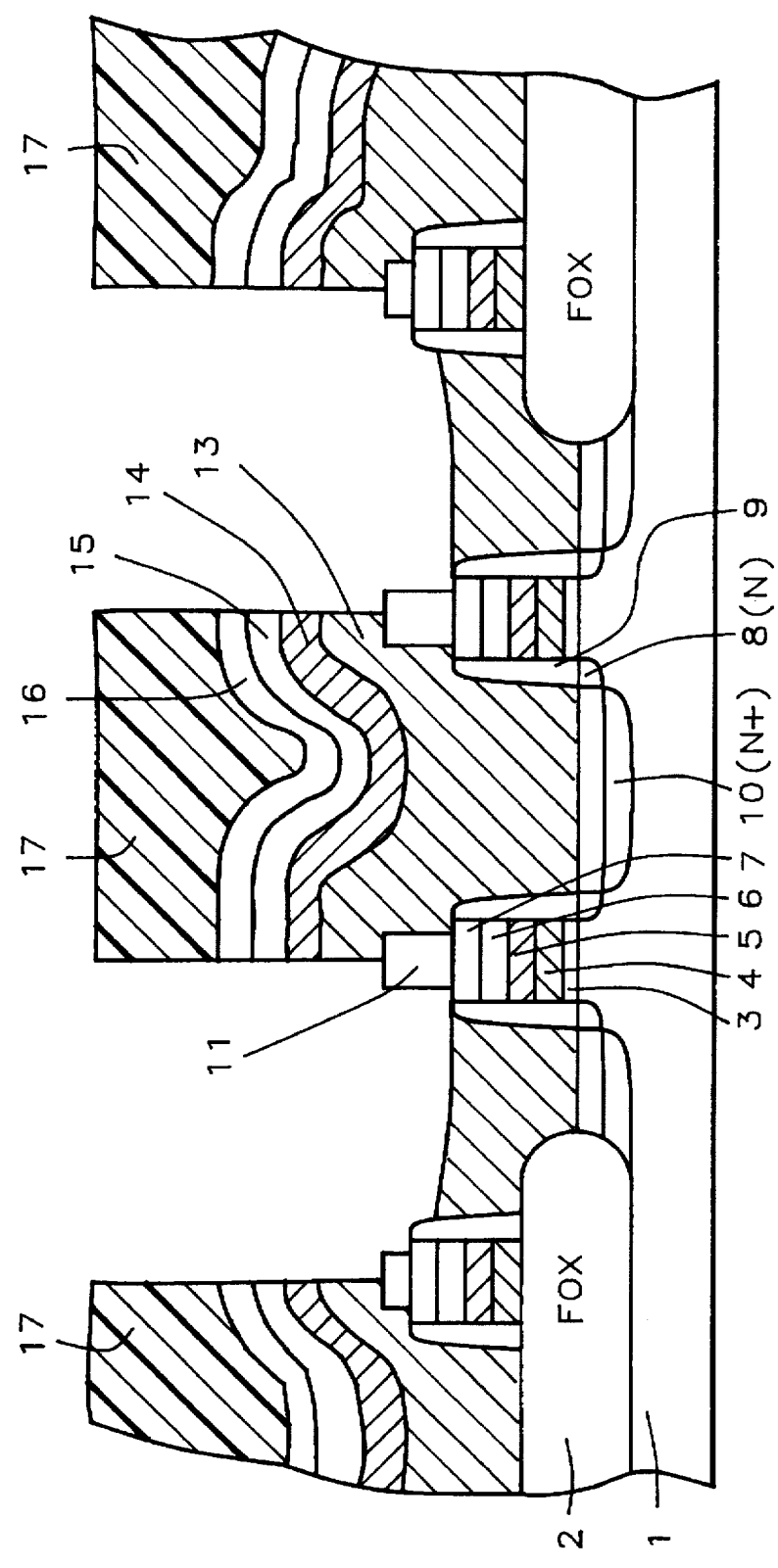

FIG. 6, shows the formation of the bit line contact structure, as well as the initial fabrication phase for the lower electrode, or storage node, of the stacked capacitor structure. Conventional photolithographic procedures are employed to create photoresist shape, 17. A RIE procedure, using $CF_4$–$CHF_3$ is used to pattern silicon nitride layer, 16, and silicon oxide layer, 15, while $Cl_2$ is used as an etchant for the patterning of second tungsten silicide layer, 14. The anisotropic RIE procedure continues, using $Cl_2$ as an etchant to completely pattern second polysilicon layer, 13, in areas where polysilicon layer, 13, overlies the polycide gate structures. However in regions between polycide gate structures, the thicker polysilicon layer, 13, is only removed to a level approximately equal to the top surface of silicon nitride layer, 16, on the polycide gate structures. Photoresist shape, 17, is then removed via plasma oxygen ashing and careful wet cleans.

Figure 7:
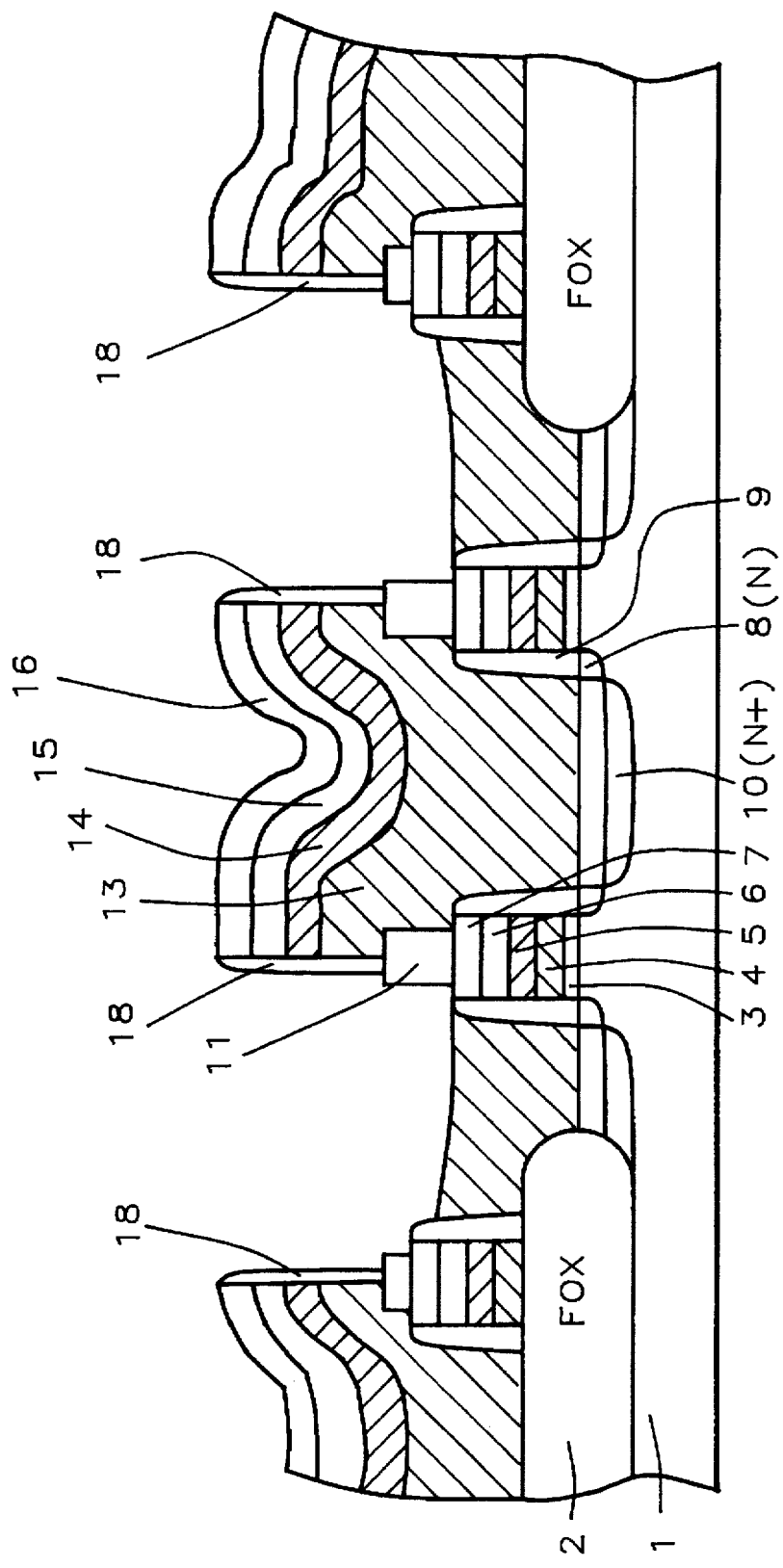
Figure 8:
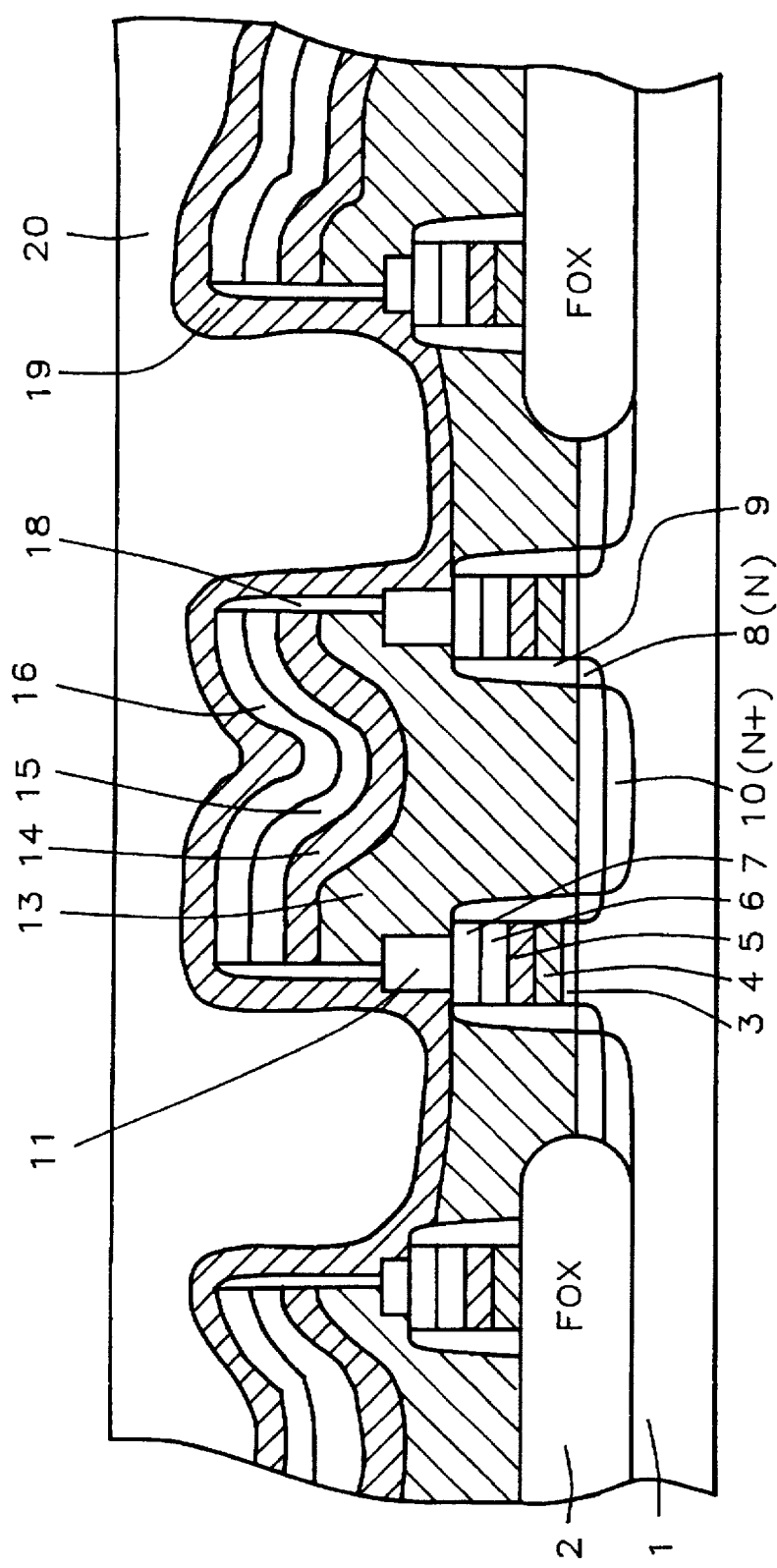
Figure 9:
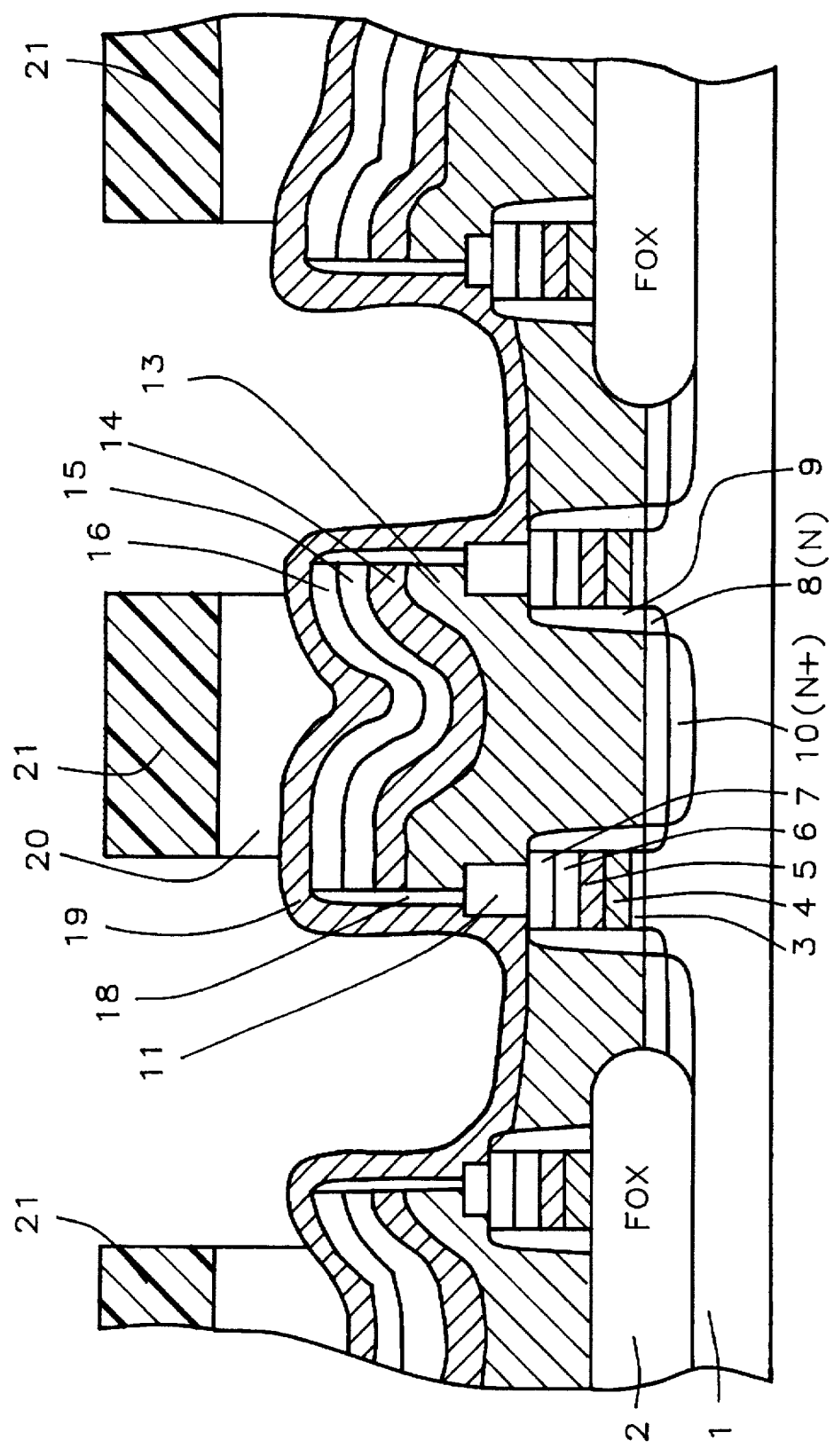

A silicon oxide layer is next deposited, at a temperature between about 500 to 800° C., to a thickness between about 500 to 1500 Angstroms, and then subjected to an anisotropic RIE procedure, using $CHF_3$ as an etchant, to form a second insulator spacer, 18, on the sides of the bit line contact structures. This is shown schematically in FIG. 7. The second insulator spacer, 18, can also be fabricated from a silicon nitride layer, or fabricated from a composite layer of silicon nitride - silicon oxide. A third polysilicon layer, 19, is next deposited, on second polysilicon layer, 13, remaining in the spaces between the polycide gate structures, as well as on the bit contact structures, in which the polysilicon component of the bit line structure is completely encapsulated by silicon nitride layer, 16, silicon oxide layer, 15, and second insulator spacer, 18. This is shown schematically in FIG. 8. The polysilicon deposition is performed using LPCVD processing, at a temperature between about 400° to 700° C., to a thickness between about 1000 to 2000 Angstroms. Doping of third polysilicon layer, 19, is once again accomplished either via insitu deposition techniques, or via a phosphorous ion implantation, into an intrinsically grown polysilicon layer.

Figure 10:
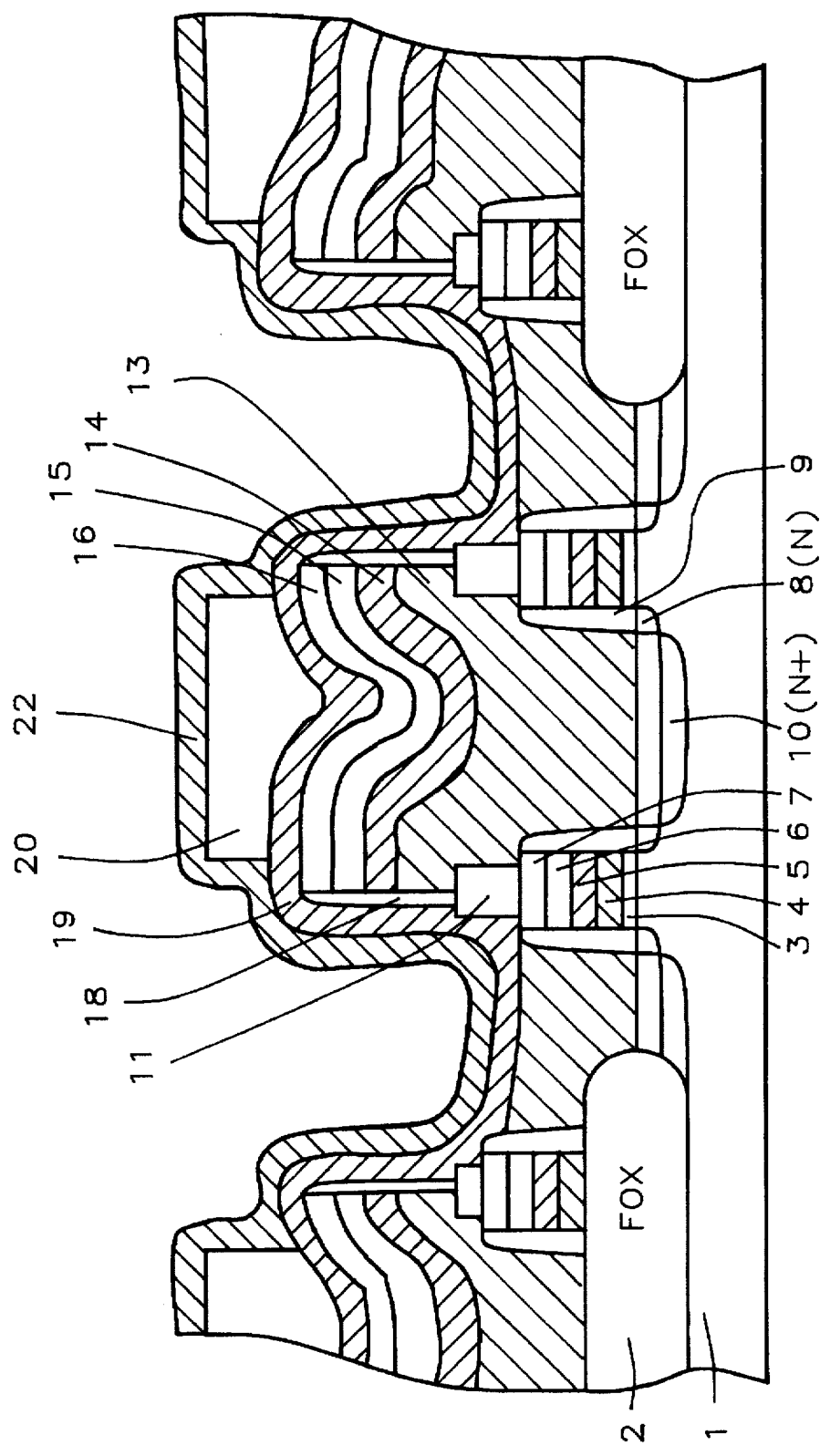

A second BPSG layer is deposited, on polysilicon layer, 19, again via CVD procedures, at a temperature between about 400 to 600° C., to a thickness between about 3000 to 9000 Angstroms. Planarization of the second BPSG layer is again accomplished via chemical mechanical polishing procedures. Photoresist pattern, 21, is formed, and used as a grid like mask to allow the creation of BPSG grids, 20, to be obtained via RIE procedures, using $CHF_3$ as an etchant, to remove the unwanted regions of second BPSG layer, 20. Photoresist pattern, 21, is removed using plasma oxygen ashing, followed by careful wet cleans. A fourth polysilicon layer, 22, is next deposited, again using LPCVD procedures, at a temperature between about 400° to 700° C., to a thickness between about 500 to 1500 Angstroms, and shown schematically in FIG. 10. Polysilicon layer, 22, can again be doped via deposition of an insitu doped layer, or via phosphorous or arsenic ion implantation procedures, used on an intrinsically grown polysilicon layer, 22.

Figure 11:
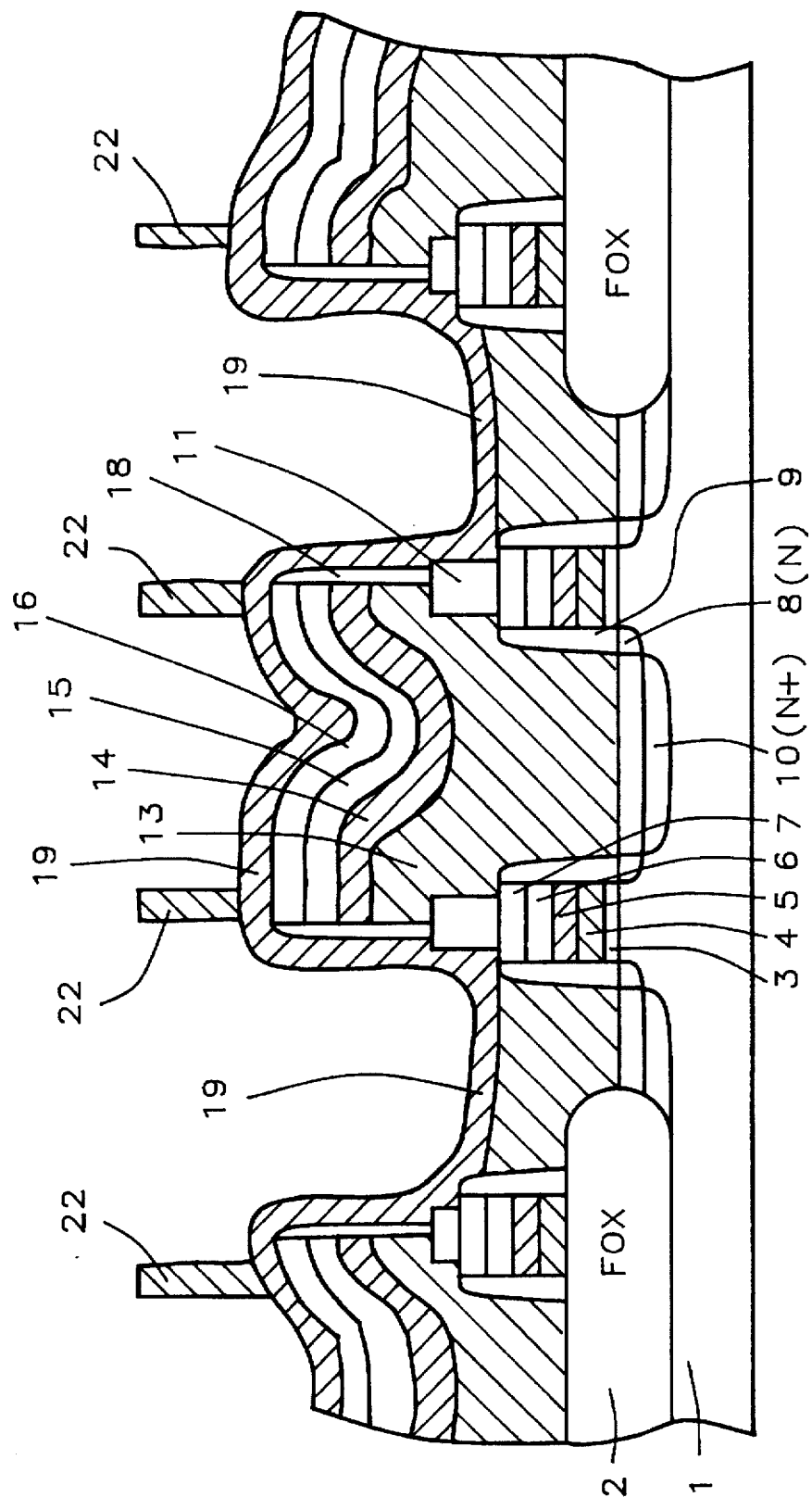
Figure 12:
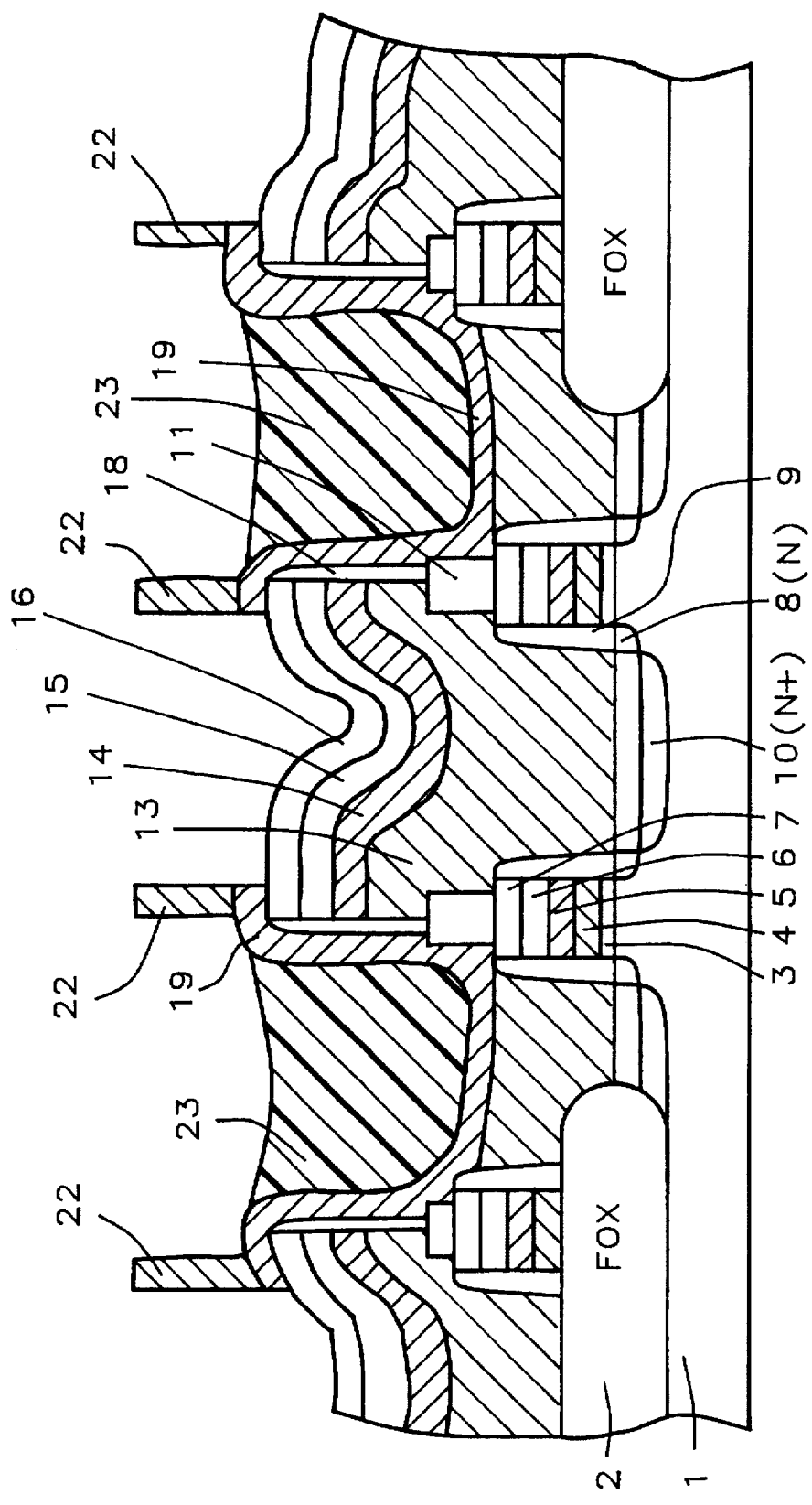

An unmasked, or blanket, anisotropic RIE procedure, using $Cl_2$ as an etchant, is used to remove polysilicon layer, 22, from the top surface of BPSG land, 20, creating sidewalls of polysilicon layer, 22, on the sides of BPSG land, 20. Polysilicon layer, 22, will also be removed from the top surface of the polysilicon layer, 19, between bit line contact structures. The exposed top surface of BPSG land, 20, allows selective removal of BPSG land, 20, via wet etching processing, using a buffered hydrofluoric acid solution, resulting in the protruding sidewalls of polysilicon layer, 22, previously residing on the sides of BPSG land, 20, and exhibiting a crown shape, or winged pattern. This is schematically shown in FIG. 11. A photoresist layer, 23, ( a spin on glass, SOG layer, or a polyimide layer, can be used in place of photoresist, if desired), is next applied, filling the spaces between bit line contact structures, and allowing a blanket, anisotropic RIE procedure, again using $Cl_2$ as an etchant, to be employed to remove polysilicon layer, 19, from the top surface of the bit line contact structure, thus isolating the bit line contact structure, from a subsequent stacked capacitor structure, that will be partly comprised of polysilicon layer, 13, polysilicon layer, 19, and polysilicon sidewalls, 22. This is shown schematically in FIG. 12. Photoresist removal is again accomplished via plasma oxygen ashing. Thus the stacked capacitor structure, has been fabricated using a process sequence allowing self-alignment of the capacitor structure to a bit line contact structure. The polysilicon sidewalls, 22, increase the surface area of the lower electrode, of a subsequent stacked capacitor structure, thus allowing an increased capacitance to be realized, when compared to counterparts, fabricated without polysilicon sidewalls.

Figure 13:
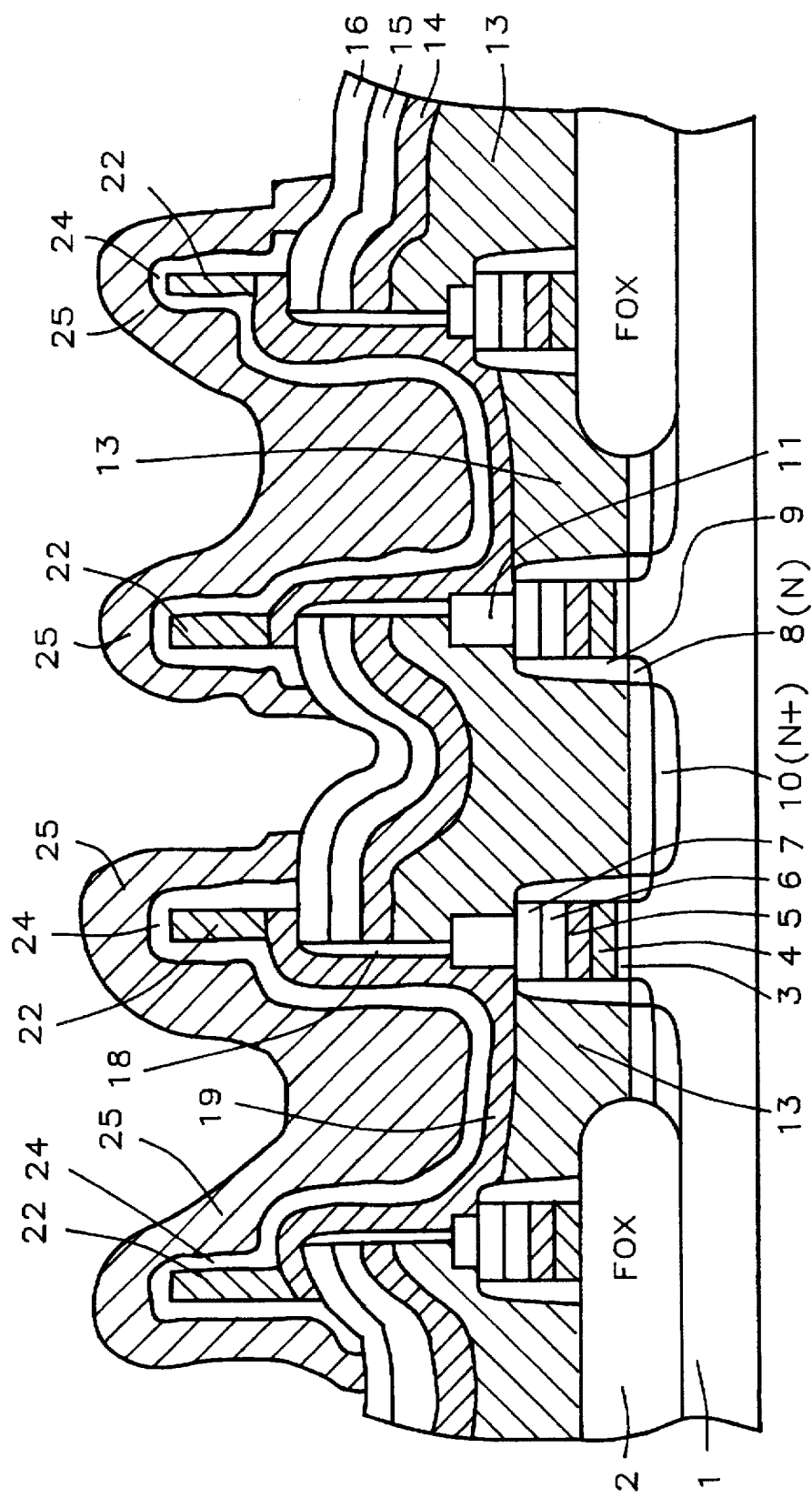

The stacked capacitor structure is completed by forming a dielectric layer, 24, on polysilicon sidewalls, 22, as well as on the top surface of polysilicon layer, 19. Dielectric layer, 24, can be a thin silicon oxide layer, thermally grown to a thickness between about 10 to 50 Angstroms. Dielectric layer, 24, can also be a composite dielectric layer, comprised of an underlying thermally grown, silicon oxide layer, and an overlying layer of LPCVD grown, silicon nitride, subjected to thermal oxidation to convert the top surface of the silicon nitride layer to a silicon oxynitride layer, resulting in an oxidized-nitride-oxide, (ONO), composite layer, with an equivalent silicon dioxide thickness between about 25 to 75 Angstroms. A fifth polysilicon layer, 25, is deposited, again using LPCVD procedures, at a temperature between about 400° to 700° C., to a thickness between about 500 to 3000 Angstroms. Doping of fifth polysilicon layer, 25, is again arrived at by either insitu deposition procedures, or phosphorous ion implantation of an intrinsically grown fifth polysilicon layer. Patterning of fifth polysilicon layer, 25, is accomplished via conventional photolithographic and anisotropic RIE procedures, using $Cl_2$ as an etchant. Photoresist removal is accomplished once again via plasma oxygen ashing and wet cleans. FIG. 13, schematically shows the completed stacked capacitor structure, with polysilicon sidewalls, 22, or wings, for enhanced capacitance, and isolated from the bit contact structures, by use of insulator self-alignment fabrication techniques.

Figure 14:
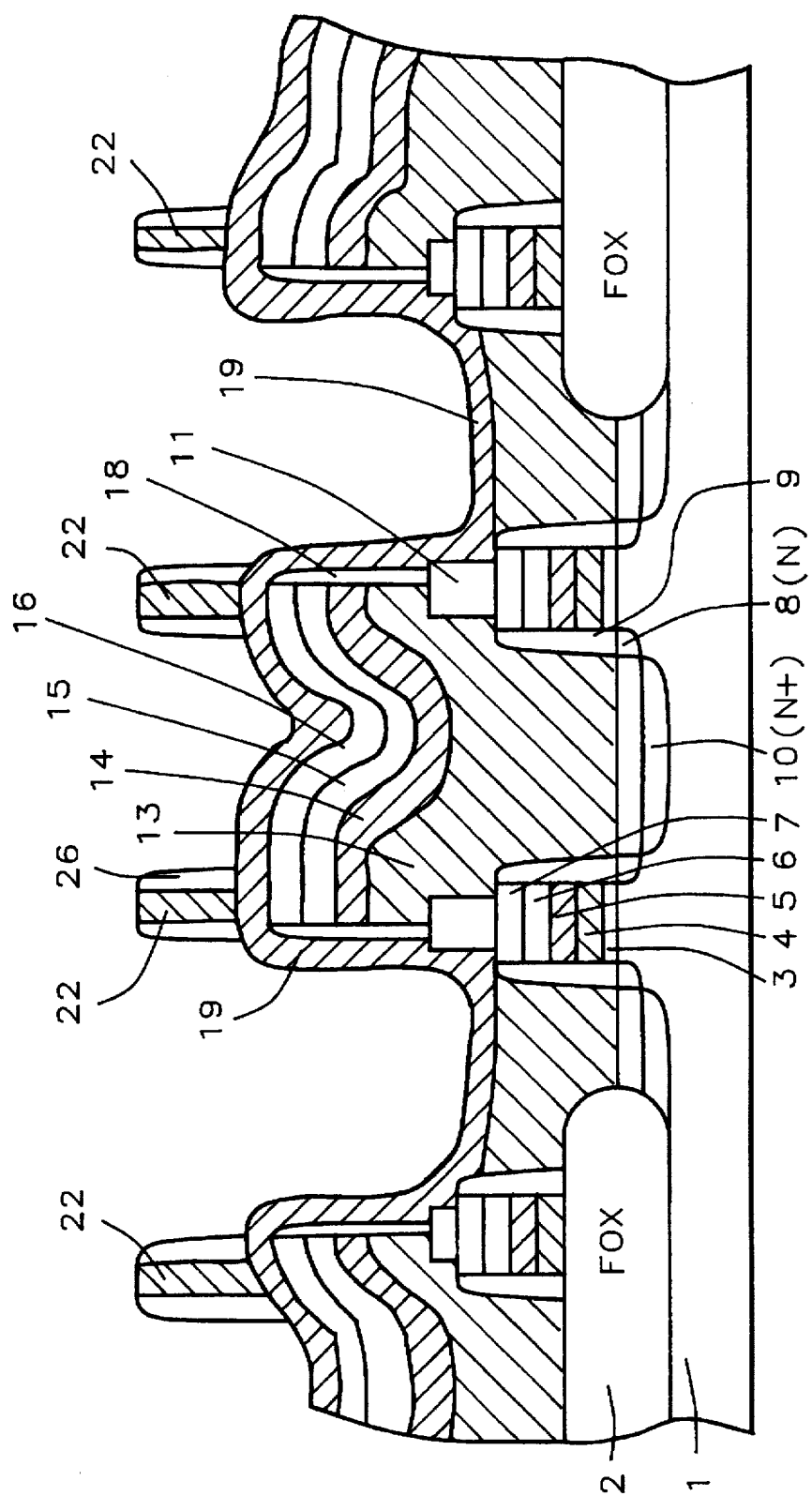
FIGS. 14–17, which schematically, in cross-sectional style, show the formation of a triple crown shape, capacitor storage node structure, using self-alignment methods for capacitor structure contacts.
Figure 15:
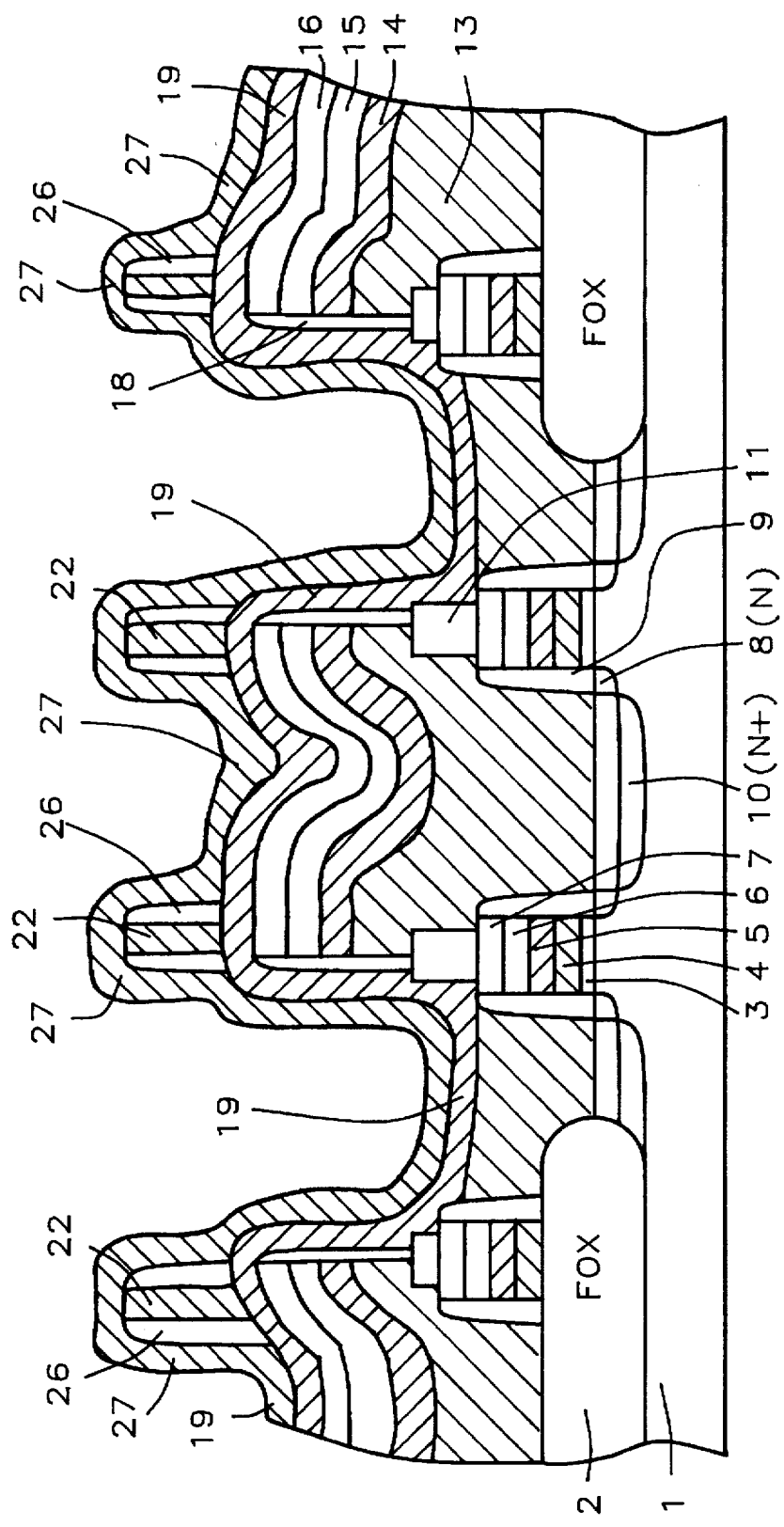
Figure 16:
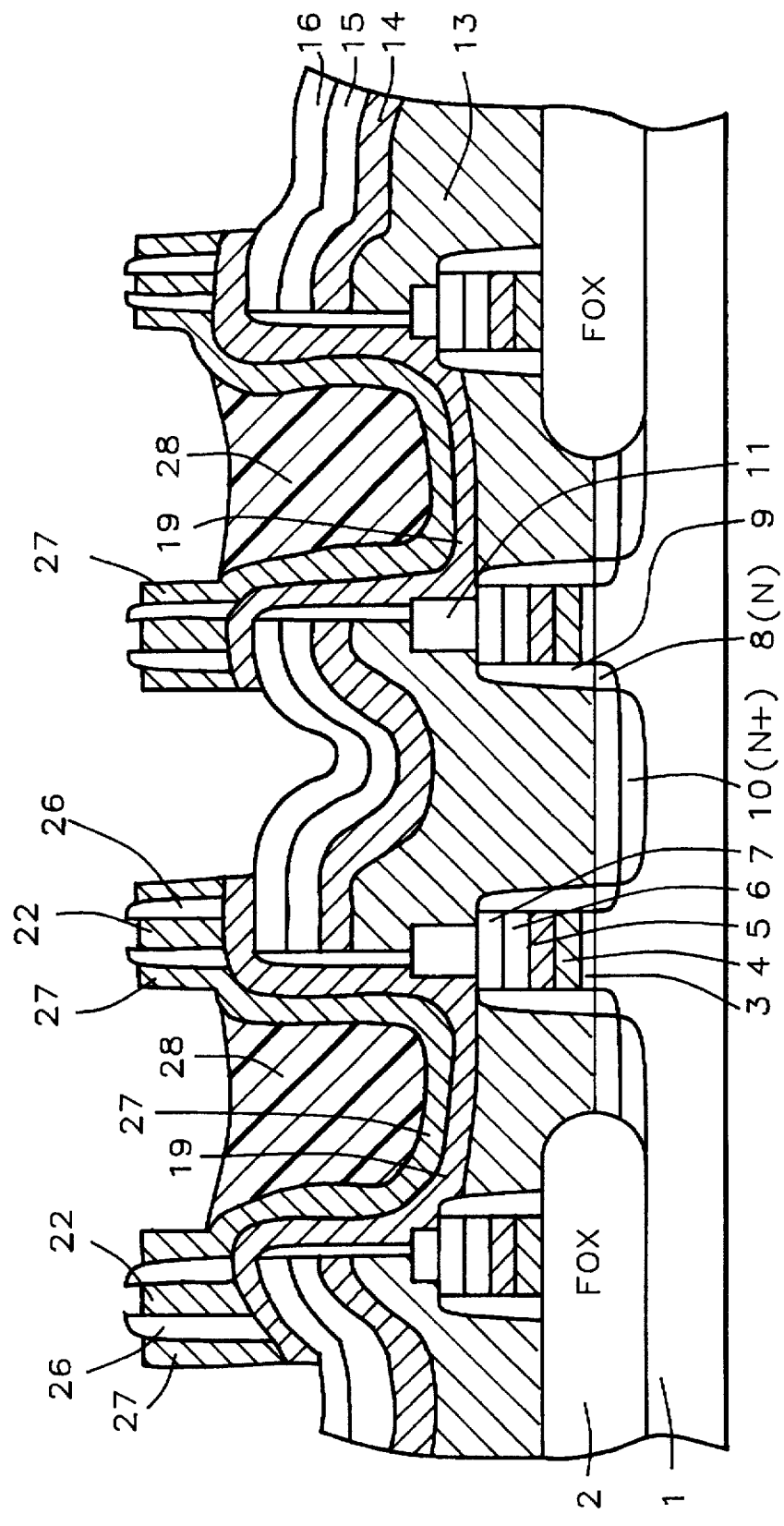
Figure 17:
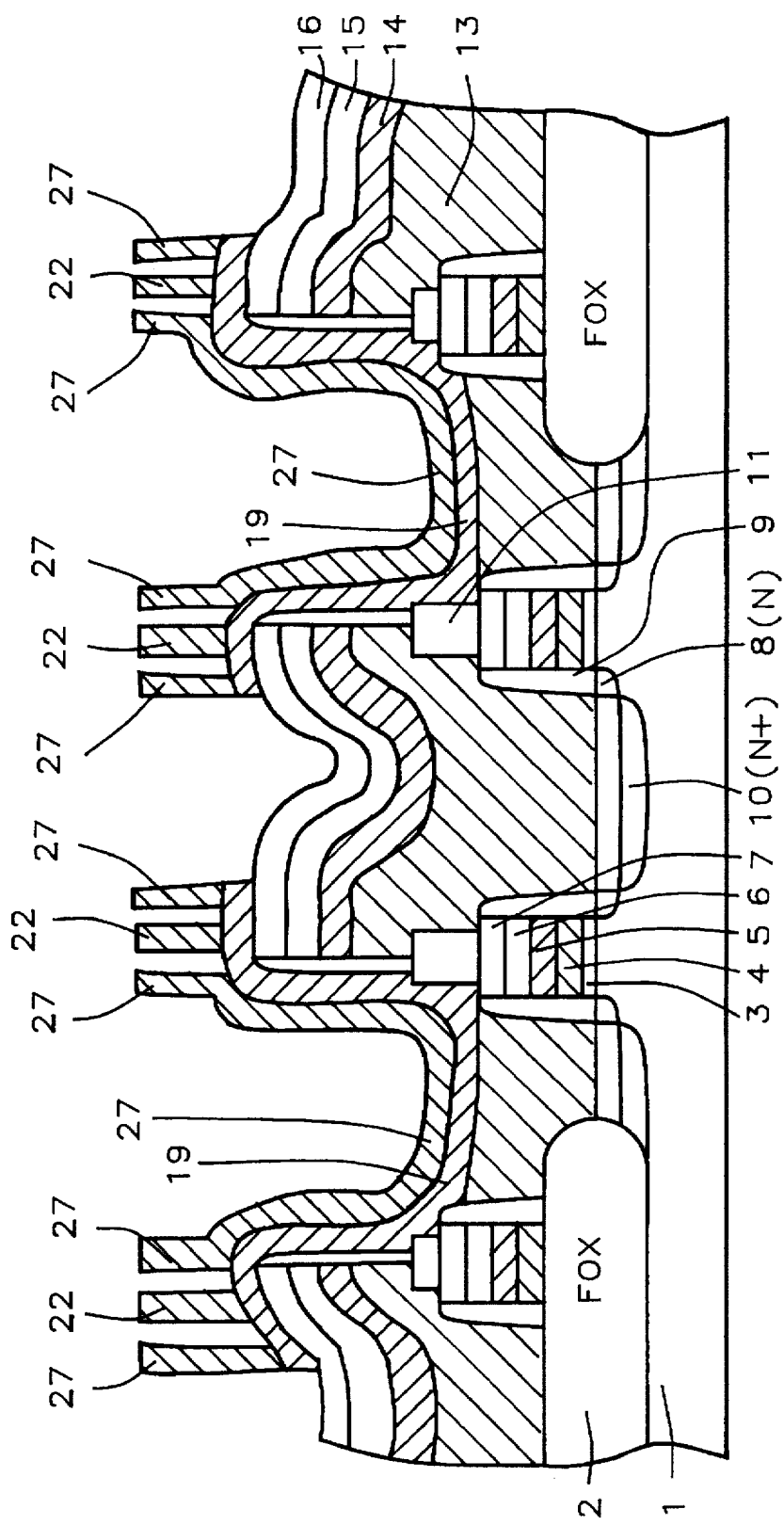

Another iteration of this invention is to use the identical processing to create the self-alignment between the stacked capacitor structure, and the bit line contact structure, however increasing the capacitor surface area by use of a triple crown shaped, lower electrode structure. Referring back to FIG. 11, a silicon oxide layer is deposited, using either LPCVD or PECVD processing, at a temperature between about 300 to 800° C., to a thickness between about 300 to 1000 Angstroms. Anisotropic, RIE procedures, using $CHF_3$ as an etchant, is used to form silicon oxide spacers, 26, on the sides of polysilicon sidewalls, 22. This is shown schematically in FIG. 14. A fifth layer of polysilicon, 27, is deposited using LPCVD procedures, at a temperature between about 400 to 700° C., to a thickness between about 500 to 1000 Angstroms, creating subsequent polysilicon sidewalls, 27, on the sides of insulator sidewall, 26. Polysilicon layer, 27, shown schematically in FIG. 15, is again doped either via insitu deposition procedures, or via arsenic or phosphorous ion implantation procedures, performed on an intrinsic polysilicon layer. A photoresist layer, 28, is next applied, filling the spaces between bit line contact structures, but allowing exposure of the top surface of polysilicon layer, 27, on top of bit line contact structures. This is shown schematically in FIG. 16. Anisotropic, RIE removal of polysilicon layer, 27, as well removal of polysilicon layer, 19, using $Cl_2$ as an etchant, result in the isolation of the subsequent lower stacked capacitor structure, from the bit line structures, as well as removal of polysilicon layer, 27, from the top surface of silicon oxide spacer, 26. This is also shown schematically in FIG. 16. Finally the silicon oxide spacer, 26, is removed via use of a wet, buffered hydrofluoric acid solution, followed by the removal of photoresist layer, 28. The result of these procedures is to form a triple crown shaped, polysilicon, stacked capacitor, lower electrode structure, comprised of an inner, polysilicon sidewalls, 22, and outer, polysilicon sidewalls, 27. This is shown schematically in FIG. 17. The completion of the stacked capacitor structure, featuring the polysilicon, triple crown shape, is accomplished in an identical manner, as previously described for the single crown shape polysilicon structure. Formation of a capacitor dielectric, followed by deposition and patterning of a sixth polysilicon layer, used for the upper electrode of the stacked capacitor structure, completes the fabrication sequence.

Although this invention has been applied to N channel, DRAM devices, it can easily be incorporated into P channel, DRAM devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a single crown shaped, stacked capacitor structure, dynamic random access memory, (DRAM), device, on a semiconductor substrate, with increased capacitor surface area available via use of said single crown shape, stacked capacitor structure, and using fabrication sequences resulting in self-alignment between said single crown shape, stacked capacitor structure, and a bit line contact structure, comprising the steps of:

forming field oxide regions in said semiconductor substrate;

growing a gate dielectric layer on the surface of said semiconductor substrate, not covered by said field oxide regions;

deposition of a first polysilicon layer on said gate dielectric layer;

deposition of a first metal silicide layer on said first polysilicon layer;

deposition of a first insulator layer on said first metal silicide layer;

deposition of a second insulator layer on said first insulator layer;

patterning of said second insulator layer, of said first insulator layer, of said first metal silicide layer, and of said first polysilicon layer, to create polycide gate structures, on said gate dielectric layer, and on said field oxide regions;

ion implanting a first conductivity imparting dopant into said semiconductor substrate, in regions between said polycide gate structures, not covered by said polycide gate structures, or by said field oxide region, to create a lightly doped source and drain region;

deposition of a third insulator layer;

anisotropic etching of said third insulator layer, to create a first insulator spacer, on the sidewalls of said polycide gate structures, and to remove said gate dielectric layer from surface of said semiconductor substrate, in regions where said semiconductor substrate is not covered by said polycide gate structures, or by said field oxide regions;

ion implanting a second conductivity imparting dopant into said semiconductor substrate, in regions between said polycide gate structures, not covered by said polycide gate structures, not covered by said first insulator spacer, and not covered by said field oxide region, to create a heavily doped source and drain region;

depositing a first boro-phosphosilicate, (BPSG), layer;

planarization of said first BPSG layer;

patterning of said first BPSG layer, to form a first BPSG land on said polycide gate structures;

deposition of a second polysilicon layer on top surface of said first BPSG land, on said polycide gate structures, and completely filling spaces between said polycide gate structures;

deposition of a second metal silicide layer on said second polysilicon layer;

deposition of a fourth insulator layer on said second metal silicide layer;

deposition of a fifth insulator layer on said fourth insulator layer;

patterning of said fifth insulator layer, of said fourth insulator layer, of said second metal silicide layer, and of said second polysilicon layer, to create a bit line contact structure, contacting said heavily doped source and drain region, between said polycide gate structures, on said gate dielectric layer, and partially overlying said polycide gate structures on said gate dielectric layer, while leaving some said second polysilicon layer remaining between said polycide gate structure on said gate dielectric layer, and said polycide gate structure on said field oxide region;

deposition of a sixth insulator layer;

anisotropic etching of said sixth insulator layer to create a second insulator spacer on the sidewalls of said bit line contact structure;

deposition of a third polysilicon layer on top surface of said bit line contact structures, and on said second polysilicon layer, remaining between said polycide gate structures;

deposition of a second BPSG layer;

planarization of said second BPSG layer;

patterning of said second BPSG layer to create a second BPSG land, on the top surface of said third polysilicon layer, overlying said bit line contact structures;

deposition of a fourth polysilicon layer;

anisotropic etching of said fourth polysilicon layer to create polysilicon spacers, on the sides of said second BPSG land;

removal of said second BPSG from between said polysilicon spacers;

application of a photoresist layer, completely filling spaces between said bit line contact structures, but exposing top surface of said third polysilicon layer, on top surface of said bit line contact structure, between said polysilicon spacers;

removal of said third polysilicon layer from top surface of said bit line contact structure, creating a lower electrode structure, of said single crown shape, stacked capacitor structure, between said bit line contact structures, comprised of underlying said second polysilicon layer, of said third polysilicon layer, and of said polysilicon spacers;

removal of said photoresist layer;

forming a capacitor dielectric layer on said lower electrode structure;

depositing a fifth polysilicon layer on said capacitor dielectric layer, on said lower electrode structure, and on top surface of said bit line contact structures, not covered by said lower electrode structure; and patterning of said fifth polysilicon layer to form upper electrode, of said stacked capacitor structure.

2. The method of claim 1, wherein said first polysilicon layer is deposited using LPCVD processing, at a temperature between about 400° to 700° C., to a thickness between about 500 to 2000 Angstroms.

3. The method of claim 1, wherein said first metal silicide layer is tungsten silicide, deposited using LPCVD processing, at a temperature between about 400° to 600° C., to a thickness between about 500 to 2000 Angstroms, using silane and tungsten hexafluoride as a source.

4. The method of claim 1, wherein said first BPSG layer is deposited using CVD processing, at a temperature between about 400° to 600° C., to a thickness between about 3000 to 10000 Angstroms.

5. The method of claim 1, wherein said second polysilicon layer is deposited using LPCVD processing, at a temperature between about 400° to 700° C., to a thickness between about 1000 to 3000 Angstroms.

6. The method of claim 1, wherein said third polysilicon layer is deposited using LPCVD processing, at a temperature between about 400° to 700° C., to a thickness between about 1000 to 2000 Angstroms.

7. The method of claim 1, wherein said second BPSG layer, used to establish the height of subsequent said polysilicon spacer, is deposited using CVD processing, at a temperature between about 400° to 600° C., to a thickness between about 3000 to 9000 Angstroms.

8. The method of claim 1, wherein said fourth polysilicon layer is deposited using LPCVD processing, at a temperature between about 400° to 700° C., to a thickness between about 500 to 1500 Angstroms.

9. The method of claim 1, wherein anisotropic RIE of said fourth polysilicon layer, used to create said polysilicon spacers, is performed using $Cl_2$ as an etchant.

10. The method of claim 1, wherein said second BPSG land is removed using a buffered hydrofluoric acid solution.

11. A method for fabricating a triple crown shape, stacked capacitor structure, dynamic random access memory, (DRAM), device, on a semiconductor substrate, with increased capacitor surface area available via use of said triple crown shape, stacked capacitor structure, and using fabrication sequences resulting in self-alignment of said triple crown shape, stacked capacitor structure, to a bit line contact structure, comprising the steps of:

forming field oxide regions in said semiconductor substrate;

growing a gate dielectric layer on the surface of said semiconductor substrate, not covered by said field oxide regions;

deposition of a first polysilicon layer on said gate dielectric layer;

deposition of a first tungsten silicide layer on said first polysilicon layer;

deposition of a first silicon oxide layer on said first tungsten silicide layer;

deposition of a first silicon nitride layer on said first silicon oxide layer;

patterning of said first silicon nitride layer, of said first silicon oxide layer, of said first tungsten silicide layer, and of said first polysilicon layer, to create polycide gate structures, on said gate dielectric layer, and on said field oxide regions;

ion implanting a first conductivity imparting dopant into said semiconductor substrate, in regions between said polycide gate structures, not covered by said polycide gate structures, or by said field oxide regions, to create a lightly doped source and drain region;

deposition of a second silicon oxide layer;

anisotropic etching of said second silicon oxide layer to create a first insulator spacer on the sides of said polycide gate structures, and to remove said gate dielectric layer from surface of said semiconductor surface, in regions where said semiconductor substrate is not covered by said polycide gate structure, or covered by said field oxide regions;

ion implanting a second conductivity imparting dopant into said semiconductor substrate, in regions between said polycide gate structures, not covered by said polycide gate structures, not covered by said first insulator spacer, and not covered by said field oxide regions, to form a heavily doped source and drain region;

deposition of a first boro-phosphosilicate, (BPSG), layer;

planarization of said first BPSG layer;

patterning of said first BPSG layer, to form a first BPSG land, on said polycide gate structure;

deposition of a second polysilicon layer on the top surface of said first BPSG land, on said polycide gate structure, and completely filling spaces between said polycide gate structures;

deposition of a second tungsten silicide layer on said second polysilicon layer;

deposition of a third silicon oxide layer on said second tungsten silicide layer;

deposition of a second silicon nitride layer on said third silicon oxide layer;

patterning of said second silicon nitride layer, of said third silicon oxide layer, of said second tungsten silicide layer, and of said second polysilicon layer, to create a bit line contact structure, contacting said heavily doped source and drain region, between said polycide gate structures, on said gate dielectric layer, and partially overlying said polycide gate structures, on said gate dielectric layer, while leaving some said second polysilicon layer remaining between said polycide gate structure, on said gate dielectric layer, and said polycide gate structures, on said field oxide regions;

deposition of a fourth silicon oxide layer;

anisotropic etching of said fourth silicon oxide layer to create a second insulator spacer on the sidewalls of said bit line contact structure;

deposition of a third polysilicon layer on the top surface of said bit line contact structures, and on said second polysilicon layer, remaining between said polycide gate structures;

deposition of a second BPSG layer;

patterning of said second BPSG layer to create a second BPSG land, on the top surface of said third polysilicon layer, overlying said bit line contact structure;

deposition of a fourth polysilicon layer;

anisotropic etching of said fourth polysilicon layer, to create first polysilicon spacers, on the sides of said second BPSG land;

removal of said second BPSG land from between said first polysilicon spacers;

deposition of a fifth silicon oxide layer;

anisotropic etching of said fifth silicon oxide layer, to form a third insulator spacer, on the sides of said first polysilicon spacers;

deposition of a fifth polysilicon layer;

application of a photoresist layer, completely filling spaces between said bit line contact structures, but exposing top surface of said fifth polysilicon layer, in regions where said fifth polysilicon layer overlies said third insulator spacer, and said first polysilicon spacer;

anisotropic etching of said fifth polysilicon layer, creating second polysilicon spacers, on sides of said third insulator spacer, exposing top surface of said third insulator spacer, and top surface of said first polysilicon spacer, while removing said fifth polysilicon layer, and said third polysilicon layer from top surface of said bit line contact structure, creating a lower electrode structure, of a triple crown shape, stacked capacitor structure, between said bit line contact structures, comprised of an underlying said second polysilicon layer, of said third polysilicon layer, of said second polysilicon spacers, and of said first polysilicon spacers;

removal of said photoresist layer;

removal of said third insulator spacer from between said second polysilicon spacer and said first polysilicon spacer;

forming a capacitor dielectric layer on said lower electrode structure;

deposition of a sixth polysilicon layer on said capacitor dielectric layer; and patterning of said sixth polysilicon layer, and of said capacitor dielectric layer, to form upper electrode structure, of said stacked capacitor structure.

12. The method of claim 11, wherein said first polysilicon layer is deposited using LPCVD processing, at a temperature between about 400° to 700° C., to a thickness between about 500 to 2000 Angstroms.

13. The method of claim 11, wherein said first tungsten silicide layer is deposited using LPCVD processing, at a temperature between about 400° to 600° C., to a thickness between about 500 to 2000 Angstroms, using silane and tungsten hexafluoride as a source.

14. The method of claim 11, wherein said second BPSG layer, used to establish the height of subsequent polysilicon spacers, is deposited using CVD processing, at a temperature between about 400° to 600° C., to a thickness between about 3000 to 10000 Angstroms.

15. The method of claim 11, wherein said fourth polysilicon layer is deposited using LPCVD processing, at a temperature between about 400° to 700° C., to a thickness between about 500 to 1500 Angstroms.

16. The method of claim 11, wherein anisotropic etching of said fourth polysilicon layer, used to create said first polysilicon spacer, is performed via RIE processing, using $Cl_2$ as an etchant.

17. The method of claim 11, wherein said fifth silicon oxide layer, used to subsequently create said third insulator spacer, is deposited using LPCVD or PECVD processing, at a temperature between about 300° to 800° C., to a thickness between about 300 to 1000 Angstroms.

18. The method of claim 11, wherein said third insulator spacer is created via anisotropic RIE, of said fifth silicon oxide layer, using $CHF_3$ as an etchant.

19. The method of claim 11, wherein said fifth polysilicon layer, is deposited using LPCVD processing, at a temperature between about 400° to 700° C., to a thickness between about 500 to 1000 Angstroms.

20. The method of claim 11, wherein anisotropic etching of said fifth polysilicon layer, used to create said second polysilicon spacers, is performed via RIE processing, using $Cl_2$ as an etchant.

21. The method of claim 11, wherein said third insulator spacer, between said second polysilicon spacers, and said first polysilicon spacers, is removed using a buffered hydrofluoric acid solution.

* * * * *